United States Patent
Foster et al.

(10) Patent No.: US 6,783,916 B2
(45) Date of Patent: Aug. 31, 2004

(54) HYDROXY-AMINO THERMALLY CURED UNDERCOAT OF 193 NM LITHOGRAPHY

(75) Inventors: Patrick Foster, Providence, RI (US); Sydney George Slater, Cumberland, RI (US); Thomas Steinhäusler, Riverside, RI (US); Andrew J. Blakeney, Seekonk, MA (US); John Joseph Biafore, Providence, RI (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 0 days.

(21) Appl. No.: 09/901,933

(22) Filed: Jul. 9, 2001

(65) Prior Publication Data

US 2002/0007018 A1 Jan. 17, 2002

Related U.S. Application Data

(62) Division of application No. 09/268,430, filed on Mar. 12, 1999, now Pat. No. 6,323,287.

(51) Int. Cl.[7] .......................... G03F 7/26; G03C 1/492; C08F 4/04
(52) U.S. Cl. ................ 430/270.1; 430/271.1; 430/320; 430/322; 430/330; 430/281.1; 525/328.8; 525/353; 525/375; 428/451; 428/500
(58) Field of Search ............................. 430/270.1, 322, 430/271.1, 330, 281.1; 525/328.8, 353, 375; 428/451, 500

(56) References Cited

U.S. PATENT DOCUMENTS

| | | | | |
|---|---|---|---|---|
| 4,454,274 A | * | 6/1984 | Singer et al. | 524/157 |
| 4,788,127 A | * | 11/1988 | Bailey et al. | 430/192 |
| 5,376,504 A | * | 12/1994 | Graziano et al. | 430/270.1 |
| 5,514,755 A | * | 5/1996 | Fenn et al. | 525/329.5 |
| 5,985,524 A | * | 11/1999 | Allen et al. | 430/326 |
| 6,054,248 A | * | 4/2000 | Foster et al. | 430/271.1 |
| 6,165,697 A | * | 12/2000 | Thackeray et al. | 430/325 |
| 6,316,165 B1 | * | 11/2001 | Pavelchek et al. | 430/311 |
| 6,323,287 B1 | * | 11/2001 | Foster et al. | 525/328.8 |
| 6,410,209 B1 | | 6/2002 | Adams et al. | 430/311 |
| 6,602,652 B2 | | 8/2003 | Adams et al. | 430/311 |
| 2002/0007018 A1 | * | 1/2002 | Foster et al. | 525/328.8 |
| 2002/0009670 A1 | * | 1/2002 | Thackeray et al. | 430/271.1 |
| 2002/0022196 A1 | * | 2/2002 | Pavelchek et al. | 430/311 |
| 2002/0031729 A1 | * | 3/2002 | Trefonas et al. | 430/322 |
| 2002/0173594 A1 | * | 11/2002 | De et al. | 525/328.8 |

* cited by examiner

*Primary Examiner*—Yvette C. Thornton
(74) *Attorney, Agent, or Firm*—Ohlandt, Greeley, Ruggiero & Perle, L.L.P.

(57) ABSTRACT

The present invention is directed to a thermally curable polymer composition, and a photolithographic substrate coated therewith, the composition comprising a hydroxyl-containing polymer, an amino cross-linking agent and a thermal acid generator. The thermally curable polymer composition may be dissolved in a solvent and used as an undercoat layer in deep UV lithography.

24 Claims, No Drawings

HYDROXY-AMINO THERMALLY CURED UNDERCOAT OF 193 NM LITHOGRAPHY

This is a divisional of U.S. patent application Ser. No. 09/268,430, filed Mar. 12, 1999 now U.S. Pat. No. 6,323,287.

FIELD OF THE INVENTION

The present invention relates to deep UV lithography used in semiconductor manufacturing and more particularly to undercoat layers for chemically amplified bilayer resist systems.

BACKGROUND TO THE INVENTION

Integrated circuit production relies on the use of photolithographic processes to define the active elements and interconnecting structures on microelectronic devices. Until recently, g-line (436 nm) and I-line (365 nm) wavelengths of light have been used for the bulk of microlithographic applications. However, in order to achieve smaller dimensions of resolution, the wavelength of light used for microlithography in semiconductor manufacturing has been reduced into the deep UV regions of 256 nm and 193 nm. The problem with using deep UV wavelengths is that resists used at the higher wavelengths were too absorbent and insensitive. Thus, in order to utilize deep UV light wavelengths, new resist materials with low optical absorption and enhanced sensitivities were needed.

Chemically amplified resist materials have recently been developed through the use of acid-labile polymers in order to meet the above-mentioned criteria. They have shown great promise in increasing resolution. However, chemically amplified resist systems have many shortcomings. One problem is standing wave effects, which occur when monochromatic deep UV light is reflected off the surface of a reflective substrate during exposure. The formation of standing waves in the resist reduces resolution and causes linewidth variations. For example, standing waves in a positive resist have a tendency to result in a foot at the resist/substrate interface reducing the resolution of the resist.

In addition, chemically amplified resist profiles and resolution may change due to substrate poisoning. Particularly, this effect occurs when the substrate has a nitride layer. It is believed that the N—H bond in the nitride film deactivates the acid at the nitride/resist interface. For a positive resist, this results in an insoluble area, and either resist scumming, or a foot at the resist/substrate interface.

Furthermore, lithographic aspect ratios require the chemically amplified resist layer be thin, e.g., about 0.5 µm, to print sub 0.18 µm features. This in turn requires the resist to have excellent plasma etch resistance such that resist image features can be transferred down into the underlying substrate. However, in order to decrease absorbance of the chemically amplified resist, aromatic groups, such as those in novolaks had to be removed, which in turn decreased the etch resistance.

Utilizing an underlayer or undercoat film that is placed on the substrate before the chemical amplified film is applied can reduce the above-mentioned problems. The undercoat absorbs most of the deep UV light attenuating standing wave effects. In addition, the undercoat prevents deactivation of the acid catalyst at the resist/substrate interface. Furthermore, the undercoat layer can contain some aromatic groups to provide etch resistance.

In the typical bilayer resist process, the undercoat layer is applied on the substrate. The chemically amplified resist is then applied on the undercoat layer, exposed to deep UV light and developed to form images in the chemically amplified resist topcoat. The bilayer resist system is then placed in an oxygen plasma etch environment to etch the undercoat in the areas where the chemically amplified resist has been removed by the development. The chemically amplified resist in a bilayer system typically contains silicon and is thus able to withstand oxygen plasma etching. After the bottom layer is etched, the resist system can be used for subsequent processing such as non-oxygen plasma etch chemistry which removes the underlying substrate.

Even though the undercoat attenuates standing waves and substrate poisoning, it poses other problems. First, some undercoat layers are soluble to the chemical amplified resist solvent component. If there is intermixing between the top and undercoat layers, the resolution and sensitivity of the top resist layer will be detrimentally affected.

In addition, if there is a large difference in the index of refraction between the chemical amplified resist and the undercoat layer, light will reflect off the undercoat layer causing standing wave effects in the resist. Thus, the index of refraction between the two layers must be matched to minimize reflectivity effects.

Another problem with undercoating layers is that they are sometimes too absorbent because of incorporation of aromatic groups. Some semiconductor manufacturing deep UV exposure tools utilize the same wavelength of light to both expose the resist and to align the exposure mask to the layer below the resist. If the undercoat layer is too absorbent, the reflected light needed for alignment is too attenuated to be useful. However, if the undercoat layer is not absorbent enough, standing waves may occur. A formulator must balance these competing objectives.

In addition, some undercoats have very poor plasma etch resistance to plasma chemistry. The etch resistance of the undercoat should be comparable to the etch rate of novolak resins in order to be commercially viable.

Furthermore, some undercoat layers require UV exposure in order to form cross-links before the radiation sensitive resist topcoat layer can be applied. The problem with UV cross-linking undercoat layers is that they require long exposure times to form sufficient cross-links. The long exposure times severely constrain throughput and add to the cost of producing integrated circuits. The UV tools also do not provide uniform exposure so that some areas of the undercoat layer may be cross-linked more than other areas of the undercoat layer. In addition, UV cross-linking exposure tools are very expensive and are not included in most resist coating tools because of expense and space limitations.

Some undercoat layers are cross-linked by heating. However, the problem with these undercoat layers is that they require high curing temperatures and long curing times before the top layer can be applied. In order to be commercially useful, undercoat layers should be curable at temperatures below 250° C. and for a time less than 180 seconds. After curing, the undercoat should have a high glass transition temperature to withstand subsequent high temperature processing.

Therefore, it is an object of the present invention to provide a thermally curable polymer composition that is useful for an undercoat layer in deep UV lithography. Another object of the present invention is to provide an undercoat layer, which is cured at temperatures less than about 250° C. and for a time less than about 3 minutes. It is a further object of this invention to provide an undercoat layer which is insoluble to the top resist's solvent system, minimizes reflectivity effects, and has an etch rate comparable to novolaks.

Other and further objects, advantages and features of the present invention shall become apparent as described below.

SUMMARY OF THE INVENTION

The present invention is directed to a thermally curable polymer composition comprising a hydroxyl-containing polymer, an amino cross-linking agent and a thermal acid generator. The thermally curable polymer composition may be dissolved in a solvent and used as an undercoat layer in deep UV lithography.

In addition, the present invention also relates to a photolithographic coated substrate comprising: a substrate, a thermally cured undercoat composition on the substrate, and a radiation-sensitive resist topcoat on the thermally cured undercoat composition. Furthermore, the present invention further relates to a process for using the photolithographic coated substrate for the production of relief structures.

DETAILED DESCRIPTION AND EMBODIMENTS

This invention relates to a thermally curable polymer composition, which may be used for forming an undercoat layer in deep UV lithography. The thermally curable polymer composition comprises a hydroxyl-containing polymer, an amino cross-linking agent and a thermal acid generator and. When the composition is heated, the thermal acid generator protonates the polyfunctional amino cross-linking agent resulting in a very strong electrophillic group. This group reacts with a hydroxyl group on the hydroxyl-containing polymer forming a cured cross-linked polymer matrix.

Any suitable amino cross-linking agent may be used in the present application such as methylolated and/or methylolated and etherified melamines, methylolated and/or methylolated and etherified guanamines and the like. The preferred amino cross-linking agents have the general formula:

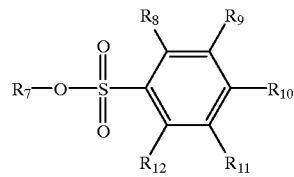

wherein Y is $NR_5R_6$ or a substituted or unsubstituted aryl or alkyl group; and $R_1$ to $R_6$ are independently a hydrogen or a group of the formula —$CH_2OH$ or —$CH_2OR_{17}$ wherein $R_{17}$ is a alkyl group of about 1 to 8 carbons.

Examples of suitable melamine cross-linking agents are methoxyaklylmelamines such as hexamethoxymethylmelamine, trimethoxymethylmelamine, hexamethoxyethylmelamine, tetramethoxyethylmelamine, hexamethoxypropylmelamine, pentamethoxypropylmelamine, and the like. The preferred melamine cross-linking agent is hexamethoxymethylmelamine.

The thermal acid generator of the present invention has the general formula:

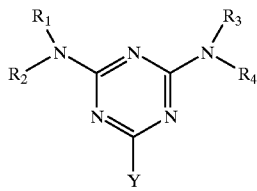

where $R_7$ is a substituted or unsubstituted alkyl, cycloalkyl or aromatic group wherein the substituted group is a halogen, alkoxy, aromatic, nitro or amino group; and $R_8$ to $R_{12}$ are independently selected from hydrogen, linear or branched $C_1$ to $C_4$ alkyl, alkoxy, amino, alkylamino, aryl, alkenyl, halogen, acyloxy, cycloalkyl, or annulated cycloalkyl, aromatic or heterocyclic. More preferable thermal acid generators are cyclohexyl p-toluenesulfonate, menthyl p-toluenesulfonate and cyclohexyl 2,4,6-triisopropylbenzenesulfonate.

Annulated means that the cycloalkyl, aromatic or heterocyclic ring is connected onto the benzene ring of the thermal acid generator such as, for example, the annulated aromatic shown below

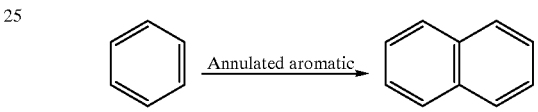

The preferred thermal acid generators are cyclohexyl p-toluenesulfonate, menthyl p-toluenesulfonate, bornyl p-toluenesulfonate, cyclohexyl triisopropylbenzenesulfonate, cyclohexyl 4-methoxybenzene sulfonate.

The thermal acid generators described above should not be considered photoacid generators. Any sensitivity that the thermal acid generators would have to UV light should be very poor, and they cannot practically be used in photolithography as a photoacid generator.

The thermally curable polymer composition also comprises a hydroxyl-containing polymer. Any suitable hydroxyl-containing polymer may be used such as polymers comprising monomer units of cyclohexanol, hydroxystyrene, hydroxyalkyl acrylate or methacrylate, hydroxycycloalkyl acrylate or methacrylate, aryalkyl alcohols, allyl alcohol and the like. This invention also contemplates copolymers, terpolymers, and the like of the foregoing named polymers. In addition, polymers containing novolaks may also be used.

Preferably, polymers comprising monomer units of cyclohexanol, hydroxystyrene hydroxyalkyl acrylate or methacrylate, arylalkyl alcohols and hydroxycycloalkyl acrylate or methacrylate have a number average molecular weight of about 9000 to 38,000, more preferably 14,000 to 30,000 and even more preferably about 18,000 to 22,000.

In addition, the thermally curable polymer composition may also further comprise monomer units of cycloaliphatic esters of acrylic or methacrylic acid. Suitable examples of monomer units of cycloaliphatic esters of acrylic or methacrylic acid are cyclohexyl acrylate or methacrylate, 4-tert-butylcyclohexyl acrylate or methacrylate and isobornyl acrylate or methacrylate, adamantyl acrylates and methacrylates, dicyclopentenyl acrylates and methacrylates, 2-(dicylcopenteneyloxy)ethyl acrylates and methacrylates and the like. The preferred monomer units of cycloaliphatic ester of acrylic or methacrylic acid are isobornyl acrylate or methacrylate.

Furthermore, the hydroxyl-containing polymer may further comprise aromatic monomer units, preferably styrene or biphenyl acrylate or methacrylate.

Examples of suitable hydroxyalkyl acrylate or methacrylates monomer units are hydroxymethyl acrylate or methacrylate, 2-hydroxyethyl acrylate or methacrylate, 3-hydroxypropyl acrylate or methacrylate, 4-hydroxybutyl acrylate or methacrylate, 5-hydroxypentyl acrylate or methacrylate, and 6-hydroxyhexyl acrylate or methacrylate and the like. Preferably, the hydroxyalkyl acrylate or methacrylate monomer units contains primary hydroxyl groups, although secondary and tertiary alcohol groups or mixtures of primary and secondary or primary, secondary and tertiary alcohol groups may be used. Suitable examples of secondary alcohols are 2-hydroxy-2-methylethyl acrylate or methacrylate, 3-hydroxy-3-methypropyl acrylate, 4-hydroxy-4-methylbutyl acrylate or methacrylate, 5-hydroxy-5-methyl propyl acrylate or methacrylate, and the like. The preferred hydroxyalkyl acrylate or methacrylate is 2-hydroxyethyl acrylate or methacrylate.

Suitable examples of arylalkyl alcohol monomer units are benzyl alcohol, 4-methyl-benzyl alcohol, 4-ethyl-benzyl alcohol, cumyl alcohol, alpha-methyl benzyl alcohol, 2-phenyl-1-ethanol, 3-phenyl-1-propanol, and 1-naphthyl methanol.

Other preferred copolymers useful in the thermally curable polymer composition are a copolymer of styrene and allyl alcohol monomer units with a weight average molecular weight of about 2000 to 20,000, preferably 2000 to 10,000; and a copolymer of hydroxystyrene and a cycloaliphatic esters of acrylic or methacrylic acid monomer units with a number average molecular weights of about 9000 to 38,000, preferably about 14,000 to 30,000, more preferably about 18,000 to 22,000.

The thermally curable polymer composition preferably contains about 75 to 95 wt. %, and more preferably about 82 to 95 wt. % of hydroxyl containing polymer. The amount of the amino cross-linking agent in the thermally curable polymer composition is preferably about 3 to 20 wt. % and more preferably about 5 to 15 wt. %. The amount of the thermal acid generator in the thermally curable polymer composition is preferably about 0.5 to 5 wt. % and more preferably about 1.5 to 3.5 wt. %.

The thermally curable polymer composition of the present invention should not begin significant cross-linking until it reaches a temperature of about 50° C. Significant cross-linking below 50° C. may lead to gel formation at room temperature, which will reduce its shelf life. Gel formation results in non-uniform coatings and linewidth variations across the substrate when the thermally curable polymer composition is used as an undercoat layer in microlithography.

The more preferable polymers of the present invention comprise polymers with the following monomer units:

Polymer 1

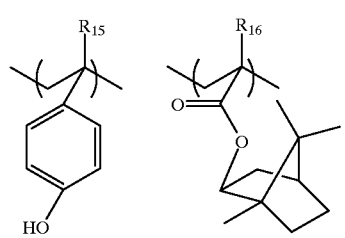

Polymer 2

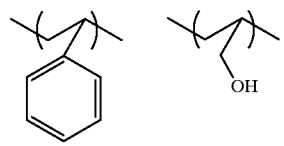

wherein $R_{15}$ and $R_{16}$ are independently selected from hydrogen or methyl.

Polymer 1 comprises about 40 to 75 mole % of isobornyl acrylate or methacrylate monomer units and about 25 to 60 mole % of hydroxystyrene monomer units.

Polymer 2 comprises about 39 to 60 mole % of styrene monomer units and about 40 to 61 mole % of allyl alcohol monomer units.

Another preferable polymer (polymer 3) is a copolymer of biphenyl acrylate or methacrylate and hydroxyethyl acrylate or methacrylate. The amount of biphenyl acrylate or methacrylate is about 50 to 90 mole % and the amount of hydroxyethyl acrylate or methacrylate is about 10 to 50 mole %.

The polymerization of the polymers described above may be carried out by any suitable polymerization process such as free radical polymerization. The number average molecular weight of Polymers 1 and 3 are about 9,000 to 38,000, preferably about 14,000 to 20,000 and more preferable about 18,000 to 22,000. The weight average molecular weight of polymer 2 is about 2,000 to 20,000, preferably about 2000 to 10,000.

The present invention also relates to a photolithographic coated substrate comprising: a substrate, a thermally cured undercoat composition on the substrate, and a radiation-sensitive resist topcoat on the thermally cured undercoat composition. The thermally cured undercoat composition comprises the thermally curable polymer composition that comprises a hydroxyl-containing polymer, an amino cross-linking agent and a thermal acid generator which has been heated to form a cross-linked matrix. Any of the polymers described above may be used as the hydroxyl-containing polymer. Preferably, the hydroxyl-containing polymer is selected from Polymers 1 or 2.

The present invention further relates to a process for using the photolithographic coated substrate for the production of relief structures comprising the steps of: providing the photolithographic coated substrate, imagewise exposing the radiation-sensitive resist topcoat to actinic radiation; and forming a resist image by developing the radiation-sensitive resist topcoat with a developer to form open areas in the radiation-sensitive resist topcoat. In addition, the thermally cured undercoat composition may be removed in the open areas of the developed radiation-sensitive resist topcoat by any suitable process such as oxygen plasma etching to form an image in the thermally cured undercoat composition.

One advantage of the thermally curable polymer composition is that it may be cured at a temperature of less than about 250° C. and for a time less than about 180 seconds. This make it particularly useful as an undercoat layer for a resist system where temperature and time constraints are important for commercial viability. Preferably, the thermally curable polymer composition is cured at temperatures between 150 to 250° C. and more preferably between temperatures of 180 to 220° C. The preferably curable times are from about 30 to 180 seconds and more preferably from about 60 to 120 seconds.

Both the undercoat and the radiation-sensitive compositions are uniformly applied to a substrate by known coating methods. The compositions are solubilized in an organic solvent and the coatings may be applied by spin-coating, dipping, knife coating, lamination, brushing, spraying, and reverse-roll coating. The coating thickness range generally covers values of about 0.1 to more than 10 μm and more preferably from about 0.1 to 1.5 um for the radiation-sensitive resist and about 0.3 to 3.0 um for the undercoat layer. After the coating operation, the solvent is generally removed by curing or drying.

Suitable solvents for both the undercoat and top radiation-sensitive compositions include ketones, ethers and esters, such as methyl ethyl ketone, methyl isobutyl ketone, 2-heptanone, cyclopentanone, cyclehexanone, 2-methoxy-1-propylene acetate, 2-methoxyethanol, 2-ethoxyethanol, 2-ethoxyethyl acetate, 1-methoxy-2-propyl acetate, 1,2-dimethoxy ethane ethyl acetate, cellosolve acetate, propylene glycol monoethyl ether acetate, propylene glycol methyl ether acetate, methyl lactate, ethyl lactate, methyl pyruvate, ethyl pyruvate, methyl 3-methoxypropionate, ethyl 3-methoxypropionate, N-methyl-2-pyrrolidone, 1,4-dioxane, ethylene glycol monoisopropyl ether, diethylene glycol monoethyl ether, diethylene glycol monomethyl ether, diethylene glycol dimethyl ether, and the like.

The radiation-sensitive resist topcoat of the present invention may be any suitable radiation-sensitive resist. It is typically a chemically amplified resist sensitive to radiation in the deep UV region such as those discussed in U.S. Pat. Nos. 5,492,793 and 5,747,622. Preferably, for a bilayer resist system, the radiation-sensitive resist will contain silicon to protect it from oxygen plasma etching. A preferable radiation sensitive resist topcoat comprises a polymer comprising the following monomer units:

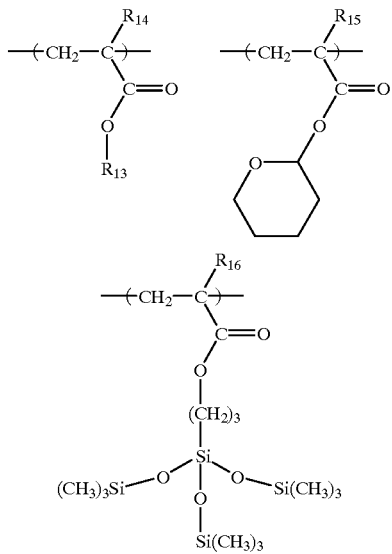

wherein $R_{13}$ is methyl or hydroxyethyl, $R_{14}$ is hydrogen, methyl or $CH_2CO_2CH_3$, and $R_{15}$ and $R_{16}$ are hydrogen or methyl, with each choice made independently.

The radiation-sensitive resist will also contain a photoacid generating (PAG) compound. The PAG compounds may be of any suitable type such as sulfonium or iodonium salts, nitrobenzyl esters, imidosulfonates esters and the like. Typically, the PAG will be present in an amount of about 1 to 10% based on the weight of the polymer.

For the production of relief structures, the radiation-sensitive resist is imagewise exposed to actinic radiation. The term 'imagewise' exposure includes both exposure through a photomask containing a predetermined pattern, exposure by means of a computer controlled laser beam which is moved over the surface of the coated substrate, exposure by means of computer-controlled electron beams, and exposure by means of X-rays or UV rays through a corresponding mask. The imagewise exposure generates acid in the exposed regions of the resist which cleaves the acid labile groups resulting in a polymer which is aqueous soluble. Typically, after imagewise exposure, the chemically amplified resist will be subjected to a post exposure heating treatment that virtually completes the reaction of the photoacid generator with the acid labile groups.

After imagewise exposure and any heat treatment of the material, the exposed areas of the top radiation-sensitive resist are typically removed by dissolution in a aqueous developer. The choice of the particular developer depends on the type of photoresist; in particular on the nature of the polymer resin or the photolysis products generated. The developer can comprise aqueous solutions of bases to which organic solvents or mixtures thereof may have been added. Particularly preferred developers are aqueous alkaline solutions. These include, for example, aqueous solutions of alkali metal silicates, phosphates, hydroxides and carbonates, but in particular of tetra alkylammonium hydroxides, and more preferably tetramethylammonium hydroxide (TMAH). If desired, relatively small amounts of wetting agents and/or organic solvents can also be added to these solutions.

The radiation-sensitive resist used for the bilayer process described above will typically contain silicon or have silicon incorporated into the resist after development. After images are formed in the radiation-sensitive resist, the substrate will be placed in an plasma-etching environment comprising oxygen so that the underlayer coating will be removed. The silicon incorporated in the radiation-sensitive resist forms silicon dioxide when exposed to an oxygen plasma and protects it from being etched so that relief structures can be formed in the undercoat layer.

After the oxygen plasma step, the substrate carrying the bilayer relief structure is generally subjected to at least one further treatment step which changes the substrate in areas not covered by the bilayer coating. Typically, this can be implantation of a dopant, deposition of another material on the substrate or an etching of the substrate. This is usually followed by the removal of the resist coating from the substrate typically by a fluorine/oxygen plasma etch.

It was surprising and unexpected that the present thermally curable polymer composition worked well as an undercoat layer for lithography with the amino cross-linking agent. There was a concern that the nitrogen bonds in the cross-linking group would deactivate the acid in a positive radiation sensitive resist resulting in an insoluble area, and either resist scumming or a foot at the resist/undercoat interface. However, the following examples showed that the resolution of the resist was excellent and that there was no scumming or foot at the resist/undercoat interface.

This invention is explained below in further detail with references to examples, which are not by way of limitation, but by way of illustration.

EXAMPLE 1

Synthesis Procedure for Polymer 1

In a 100 ml three-necked round bottom flask equipped with a magnetic stir bar, addition funnel, condenser, and nitrogen inlet-outlet was added a mixture of 21.0 g of isobornyl methacrylate, 9.0 g of 4-hydroxystyrene 30 ml of tetrahydrofuran (THF) and 0.45 g of 2,2'-azobis(2-methylbutyronitrile). The mixture was heated to 65° C. and stirred for 18 hours. The solution was precipitated by addition to 1 liter of hexanes, and the precipitate was filtered. The solid was dried for 1 hour under a water aspirator vacuum, subsequently dissolved in 80 ml of THF and reprecipitated in 1 liter of hexanes. The precipitate was filtered, and the solid dried at 4 mbar for 24 hours. The yield of polymer was between 77–80%. The above polymer was suspended in a mixture of 70 ml isoproponal, 50 ml THF and 29.5 ml of $NH_4OH$ under a nitrogen atmosphere. After refluxing overnight, the solution was cooled and precipitated by adding 1 liter of water. The suspension was filtered and washed with 50 ml of water and 50 ml of hexanes. The solid was redissolved in THF and precipitated by the addition of 1.2 liter of hexanes. The precipitate was filtered according to the above procedure. The solid was dried at 4 mbar for 24 hours. Molecular weights and molecular weight distributions were measured using a Waters Corp. liquid chromatograph. The number average molecular weight was 25,923 and the polydispersity (Mw/Mn) was 2.80. Thermal decomposition measurements (TGA) were performed using a Perkin-Elmer thermal gravimetric analyzer (TGA-7) giving a weight loss of 50% between 260–380° C. The structure and composition of polymers was analyzed using a Bruker 250 MHz NMR-spectrometer. The mole % of isobornyl methacrylate was 60% and the mole % of hydroxystyrene was 40%.

EXAMPLE 2

Thermally Curable Polymer Composition using Polymer 1

A 15% by weight thermally curable polymer composition was formulated by combining 2.18 g of Polymer 1 from Example 1 above, 0.3 g of hexamethoxymethylmelamine and 0.8 g of cyclohexyl p-toluenesulfonate in 17 g of propylene glycol methyl ether acetate (PGMEA). The mixture was rolled overnight, and the undercoat solution was filtered twice through a 0.1 µm Teflon filter.

EXAMPLE 3

Thermally Curable Polymer Composition using Polymer 2

A 15% by weight thermally curable polymer composition was formulated by combining 2.18 g of Polymer 2 obtained from Scientific Polymer Products, Inc. (60 mole % styrene and 40 mole % allyl alcohol), 0.3 g of hexamethoxymethylmelamine and 0.8 g of cyclohexyl p-toluenesulfonate in 17 g of propylene glycol methyl ether acetate (PGMEA). The mixture was rolled overnight, and the undercoat solution was filtered twice through a 0.1 µm filter.

EXAMPLE 4

Preparation of Bilayer Resist

A silicon wafer was spin coated with the formulation of Example 1 and baked at 200° C. for 1 min to yield a 0.50 µm thick film. A radiation-sensitive resist topcoat was spin coated over the undercoat layer and baked at 100° C. for 1 min to yield a 0.25 µm thick film. The radiation-sensitive resist topcoat was a chemically amplified resist system comprising a terpolymer of tetrahydropyranylmethacrylate/methyl methacrylate/methacryloxypropyl tris(trimethoxy) silane, a triphenylsulfonium-triflate PAG, a triphenylimidole base compound and PGMEA solvent. The coated wafer was then exposed using an ISI 248 nm wavelength stepper. The wafer was post exposure baked at 100° C. for 1 min and developed for 30 sec in 0.262 N aqueous TMAH. The wafer was spun dry and the image was analyzed by scanning electron microscopy (SEM). The SEM's showed that there was no scumming or foot at the resist/undercoat interface, no standing waves, and no intermixing of the undercoat and the imaging layer. The bilayer resolution was excellent and could resolve features as small as 0.14 µm in a dense line structure and 0.12 um for an isolated line structure. In addition, the glass transition temperature of the undercoat was greater than 250° C., which shows that it can withstand subsequent high temperature processing. Furthermore, the oxygen plasma etch rate of the undercoat was within 15% of the etch rate of novolaks.

EXAMPLES 5–12

Preparation and Lithographic Results of Bilayer Resist

Table 1 below shows the lithographic results of different formulations of polymer 1 in Example 2 with an amino cross-linking agent (hexamethoxymethylmelamine) and a thermal acid generator (cyclohexyl p-toluenesulfonate). The formulation and lithographic procedures are the same as Examples 2 and 4.

TABLE 1

| Example | Polymer 1 (grams) | Cross-linking Agent (grams) | Thermal Acid Generator (grams) | PGMEA (grams) | Resolution Dense lines (um) | Resolution Isolated Lines (um) |
|---|---|---|---|---|---|---|
| 5 | 2.75 | 0.15 | 0.11 | 17 | 0.14 | 0.13 |
| 6 | 2.60 | 0.30 | 0.11 | 17 | 0.14 | 0.13 |
| 7 | 2.70 | 0.23 | 0.08 | 17 | 0.14 | 0.12 |
| 8 | 2.81 | 0.15 | 0.05 | 17 | 0.14 | 0.13 |
| 9 | 2.41 | 0.27 | 0.04 | 15.4 | 0.14 | 0.12 |
| 10 | 3.71 | 0.68 | 0.11 | 25.5 | 0.15 | 0.13 |
| 11 | 3.94 | 0.45 | 0.11 | 25.5 | 0.14 | 0.12 |
| 12 | 4.16 | 0.23 | 0.11 | 25.5 | 0.15 | 0.13 |

SEM's showed that there were no scumming or foot at the resist/undercoat interface, no standing waves, and no intermixing of the undercoat and the imaging layer.

EXAMPLES 13–14

Preparation and Lithographic Results of Bilayer Resist

Table 2 below the lithographic results of two copolymers of hydroxystyrene and isobornyl methacrylate formulated with the amino cross-linking agent and thermal acid generator described in Examples 5 through 12. The polymer in example 13 contains 55 mole % hydroxystyrene and 45 mole % isobornyl methacrylate. The polymer in example 14 contains 25 mole % hydroxystyrene and 75 mole % isobornyl methacrylate.

TABLE 2

| Example | Polymer (grams) | Cross-linking Agent (grams) | Thermal Acid Generator (grams) | PGMEA (grams) | Resolution Dense lines (um) | Resolution Isolated Lines (um) |
|---|---|---|---|---|---|---|
| 13 | 3.84 | 0.53 | 0.13 | 25.5 | 0.15 | 0.13 |
| 14 | 3.84 | 0.53 | 0.13 | 25.5 | 0.15 | 0.13 |

SEM's showed that there were no scumming or foot at the resist/undercoat interface, no standing waves, and no intermixing of the undercoat and the imaging layer.

The foregoing is illustrative of the present invention and is not construed as limiting thereof. The invention is defined by the following claims with equivalents of the claims to be included therein.

What is claimed is:

1. A photolithographic sensitive coated susbstrate comprising:
   (a) a substrate;
   (b) a thermally cured undercoat on the substrate; and
   (c) a radiation-sensitive resist topcoat on the thermally cured undercoat;
   wherein said thermally cured undercoat comprises a thermally cured composition comprising a hydroxyl-containing polymer, an amino cross-linking agent and a thermal acid generator;
   wherein said hydroxyl-containing polymer further comprises monomer units of cycloaliphatic ester of acrylic or methacrylic acid units, and
   wherein said radiation-sensitive resist topcoat is a chemically amplified resist containing silicon.

2. The coated substrate of claim 1 wherein said hydroxyl-containing polymer comprises monomer units selected from the group consisting of: hydroxystyrene, hydroxyalkyl acrylate or methacrylate, hydroxycycloalkyl acrylate or methacrylate, benzyl alcohols, and allyl alcohol monomer units.

3. The coated substrate of claim 2 wherein said hydroxyl-containing polymer comprises monomer units selected from the group consisting of: hydroxyalkyl acrylate or methacrylate and allyl alcohol units.

4. The coated substrate of claim 3 wherein said thermal acid generator has the general structure:

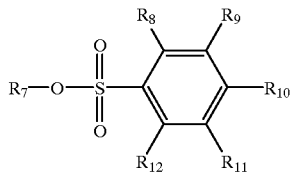

where $R_7$ is a substituted or unsubstituted alkyl, cycloalkyl or aromatic group wherein the substituted group is halogen, alkoxy, aromatic, nitro or amino group; and $R_8$ to $R_{12}$ are independently selected from hydrogen, linear or branched $C_1$ to $C_4$ alkyl, alkoxy, amino, alkylamino, aryl, alkenyl, halogen, acyloxy, cycloalkyl, or annulated cycloalkyl, aromatic and heterocyclic groups.

5. The coated substrate of claim 1 wherein said hydroxyl-containing polymer comprises the following monomer units:

(A)

(B)

wherein $R_{15}$ and $R_{16}$ are independently a hydrogen or a methyl.

6. The coated substrate of claim 5 wherein the mole % of monomer unit (A) is about 25 to 60 mole % and the mole % of monomer unit (B) is about 40 to 75 mole %.

7. The coated substrate of claim 1 wherein said amino cross-linking agent has the general formula

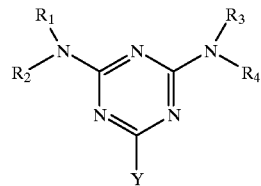

wherein Y is $NR_5R_6$, or a substituted or unsubstituted aryl or alkyl group, $R_1$ to $R_6$ are independently a hydrogen or a group of the formula —$CH_2OH$ or $CH_2OR_{17}$ where $R_{17}$ is a alkyl group of about 1 to 8 carbons.

8. A process for the production of relief structures comprising the steps of:
   (a) forming a coated substrate; wherein said coated substrate comprises a substrate; a thermally cured undercoat disposed on said substrate; and a radiation-sensitive resist topcoat disposed on said thermally cured undercoat; wherein said thermally cured undercoat comprises a thermally cured composition comprising a hydroxyl-containing polymer, an amino cross-linking agent and a thermal acid generator; and wherein said hydroxyl-containing polymer further comprises monomer units of cycloaliphatic ester of acrylic or methacrylic acid units;
(b) imagewise exposing said radiation-sensitive resist topcoat to actinic radiation; and
(c) forming a resist image by developing said radiation-sensitive resist topcoat with a developer.

9. The process of claim 8, wherein said hydroxyl-containing polymer comprises the following monomer units:

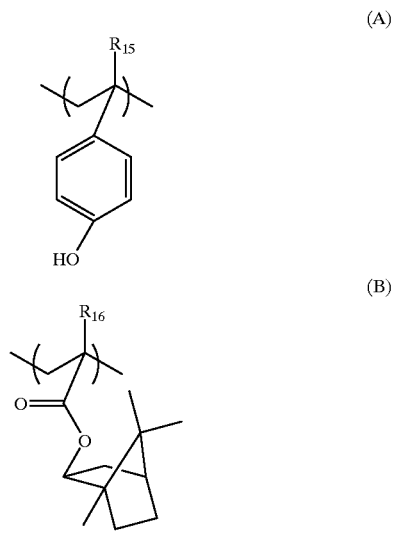

wherein $R_{15}$ and $R_{16}$ are independently a hydrogen or a methyl.

10. The process of claim 9, wherein the mole % of monomer unit (A) is about 25 to 60 mole % and the mole % of monomer unit (B) is about 40 to 75 mole %.

11. The process of claim 42, further comprising the step of:
removing said thermally cured undercoat composition to form an image thereof.

12. A process for the production of relief structures comprising the steps of:
(a) forming a coated substrate; wherein said coated substrate comprises a substrate; a thermally cured undercoat disposed on said substrate; and a radiation-sensitive resist topcoat disposed on said thermally cured undercoat; wherein said thermally cured undercoat comprises a thermally cured composition comprising a hydroxyl-containing polymer comprising about 30 to 60 mole % of hydroxystyrene monomer units and 40 to 70 mole % of isobornyl acrylate or methacrylate monomer units, an amino cross-linking agent and a thermal acid generator; and wherein said radiation-sensitive resist topcoat is a chemically amplified resist containing silicon;
(b) imagewise exposing said radiation-sensitive resist topcoat to actinic radiation; and
(c) forming a resist image by developing said radiation-sensitive resist topcoat with a developer.

13. The process of claim 8, further comprising the step of:
removing said thermally cured undercoat composition to form an image thereof.

14. A photolithographic sensitive coated substrate comprising:

(a) a substrate;
(b) a thermally cured undercoat on the substrate; and
(c) a radiation-sensitive resist topcoat on the thermally cured undercoat;
wherein said thermally cured undercoat comprises a thermally cured composition comprising a hydroxyl-containing polymer, an amino cross-linking agent and a thermal acid generator;
wherein said hydroxyl-containing polymer further comprises monomer units of cycloaliphatic ester of acrylic or methacrylic acid units.

15. The coated substrate of claim 14, wherein said thermal acid generator has the general structure:

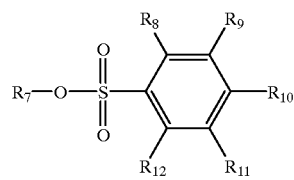

where $R_7$ is a substituted or unsubstituted alkyl, cycloalkyl or aromatic group wherein the substituted group is halogen, alkoxy, aromatic, nitro or amino group; and $R_8$ to $R_{12}$ are independently selected from hydrogen, linear or branched $C_1$ to $C_4$ alkyl, alkoxy, amino, alkylamino, aryl, alkenyl, halogen, acyloxy, cycloalkyl, or annulated cycloalkyl, aromatic and heterocyclic groups.

16. The coated substrate of claim 14, twherein said hydroxyl-containing polymer comprises the following monomer units:

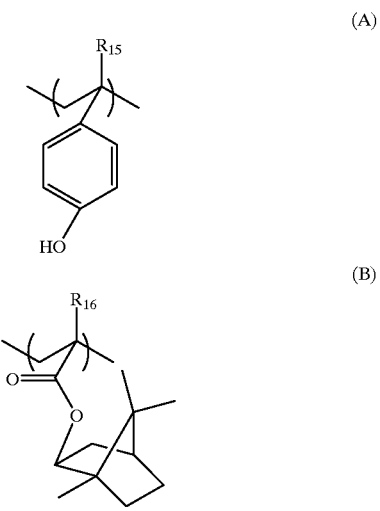

wherein $R_{15}$ and $R_{16}$ are independently a hydrogen or a methyl.

17. The coated substrate of claim 16, wherein the mole % of monomer unit (A) is about 25 to 60 mole % and the mole % of monomer unit (B) is about 40 to 75 mole %.

18. The coated substrate of claim 14 wherein said amino cross-linking agent has the general formula

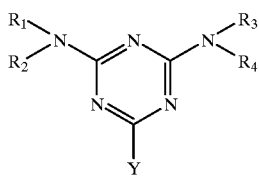

wherein Y is $NR_5R_6$, or a substituted or unsubstituted aryl or alkyl group, $R_1$ to $R_6$ are independently a hydrogen or a group of the formula —$CH_2OH$ or $CH_2OR_{17}$ where $R_{17}$ is an alkyl group of about 1 to 8 carbons.

19. A photolithographic sensitive coated substrate comprising:
   (a) a substrate;
   (b) a thermally cured undercoat on the substrate; and
   (c) a radiation-sensitive resist topcoat on the thermally cured undercoat;
   wherein said thermally cured undercoat comprises a thermally cured composition comprising a hydroxyl-containing polymer, an amino cross-linking agent and a thermal acid generator;
   wherein said hydroxyl-containing polymer comprises biphenyl acrylate or methacrylate and hydroxyethyl acrylate or methacrylate.

20. The coated substrate of claim 19, wherein said thermal acid generator has the general structure:

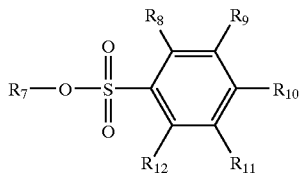

where $R_7$ is a substituted or unsubstituted alkyl, cycloalkyl or aromatic group wherein the substituted group is halogen, alkoxy, aromatic, nitro or amino group; and $R_8$ to $R_{12}$ are independently selected from hydrogen, linear or branched $C_1$ to $C_4$ alkyl, alkoxy, amino, alkylamino, aryl, alkenyl, halogen, acyloxy, cycloalkyl, or annulated cycloalkyl, aromatic and heterocyclic groups.

21. The coated substrate of claim 19 wherein said amino cross-linking agent has the general formula

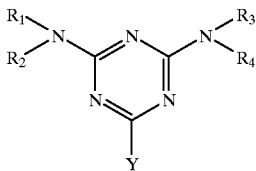

wherein Y is $NR_5R_6$, or a substituted or unsubstituted aryl or alkyl group, $R_1$ to $R_6$ are independently a hydrogen or a group of the formula —$CH_2OH$ or $CH_2OR_{17}$ where $R_{17}$ is an alkyl group of about 1 to 8 carbons.

22. A process for the production of relief structures comprising the steps of:
   (a) forming a coated substrate; wherein said coated substrate comprises a substrate; a thermally cured undercoat disposed on said substrate; and a radiation-sensitive resist topcoat disposed on said thermally cured undercoat; wherein said thermally cured undercoat comprises a thermally cured composition comprising a hydroxyl-containing polymer, an amino cross-linking agent and a thermal acid generator; and wherein said hydroxyl-containing polymer comprises biphenyl acrylate or methacrylate and hydroxyethyl acrylate or methacrylate;
   (b) imagewise exposing said radiation-sensitive resist topcoat to actinic radiation; and
   (c) forming a resist image by developing said radiation-sensitive resist topcoat with a developer.

23. The process of claim 22, wherein the amount of biphenyl acrylate or methacrylate is about 50 to 90 mole % and the amount of hydroxyethyl acrylate or methacrylate is about 10 to 50 mole %.

24. The process of claim 22, further comprising the step of:
   removing said thermally cured undercoat composition to form an image thereof.

* * * * *